United States Patent [19]
Sanchez et al.

[11] Patent Number: 6,156,588
[45] Date of Patent: Dec. 5, 2000

[54] METHOD OF FORMING ANTI-FUSE STRUCTURE

[75] Inventors: Ivan Sanchez; Miguel A. Delgado, both of San Antonio, Tex.

[73] Assignee: VLSI Technology, Inc., San Jose, Calif.

[21] Appl. No.: 09/102,367

[22] Filed: Jun. 23, 1998

[51] Int. Cl.$^7$ .................................................. H01L 21/82
[52] U.S. Cl. ........................ 438/131; 438/467; 438/600
[58] Field of Search .................................. 438/381, 131, 438/466, 467, 598, 600

[56] References Cited

U.S. PATENT DOCUMENTS

| | | | |
|---|---|---|---|
| 4,914,055 | 4/1990 | Gordon et al. | 438/600 |
| 5,120,679 | 6/1992 | Boardman et al. | 438/600 |
| 5,328,865 | 7/1994 | Boardman et al. | 438/600 |

FOREIGN PATENT DOCUMENTS 2-146745  6/1990  Japan .

*Primary Examiner*—Carl Whitehead, Jr.
*Assistant Examiner*—Jeff Vockrodt
*Attorney, Agent, or Firm*—Burns Doane Swecker & Mathis, L.L.P.

[57] ABSTRACT

The invention relates generally to integrated circuits and, in particular, to methods of forming anti-fuse structures during integrated circuit manufacture. In an exemplary embodiment of the invention, a conductive base layer is formed over a semiconductor substrate. An insulating layer is formed on the conductive base layer and is patterned to expose a portion of the conductive base layer. An anti-fuse layer is formed on the insulating layer and the exposed portion of the conductive base layer. A conductive protection layer is formed on the anti-fuse layer. An anti-fuse island is formed by sequentially removing a portion of the conductive protection layer, and underlying portions of the anti-fuse layer and the insulating layer. The conductive base layer is patterned after forming the anti-fuse island. The invention provides a simplified method for the formation of anti-fuse structures which is compatible with submicron device geometries.

19 Claims, 3 Drawing Sheets

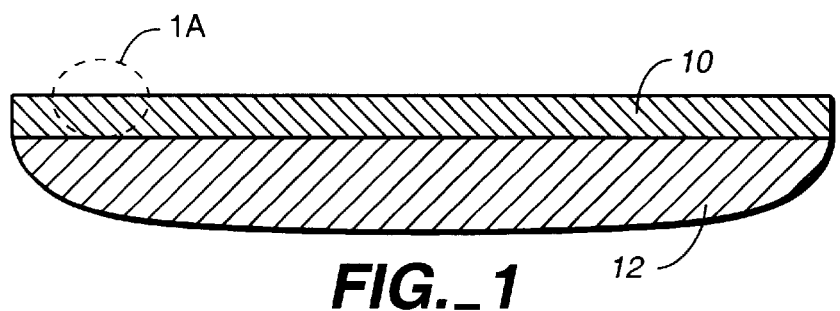
FIG._1
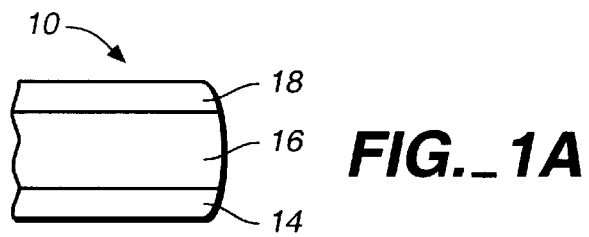
FIG._1A
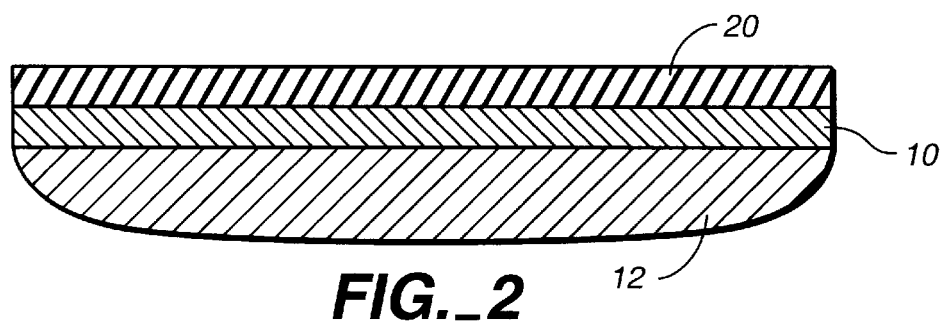
FIG._2
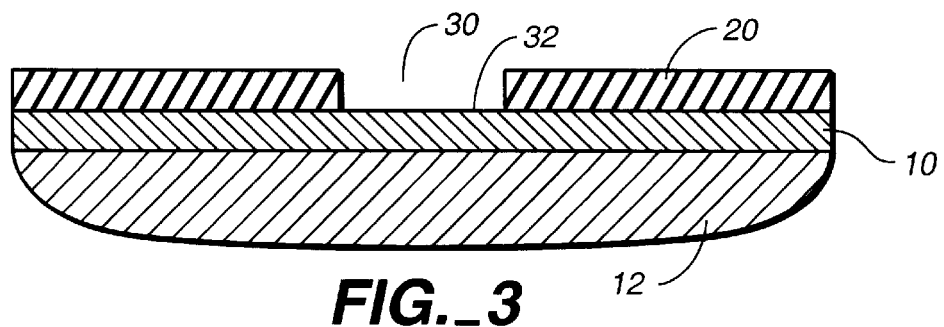
FIG._3

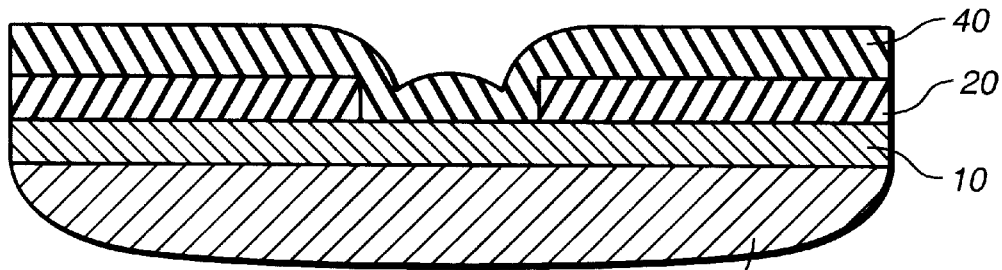
FIG._4
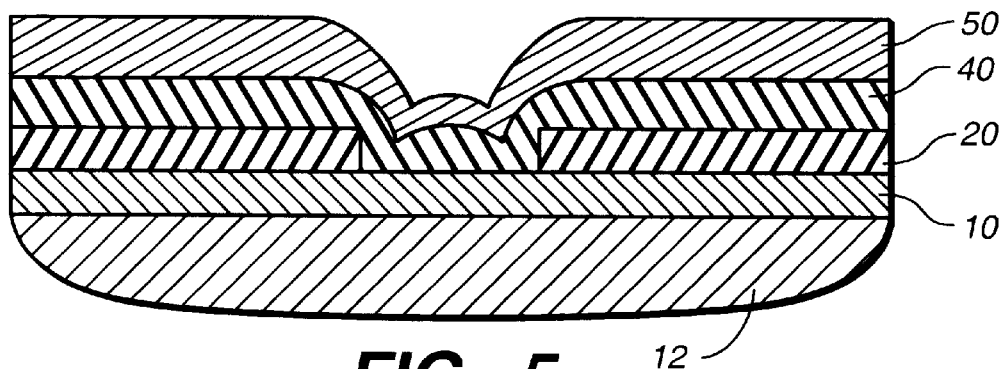
FIG._5
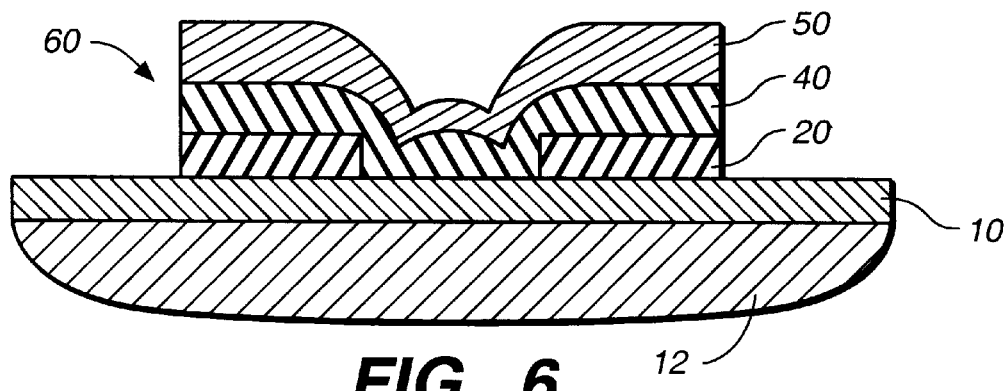
FIG._6

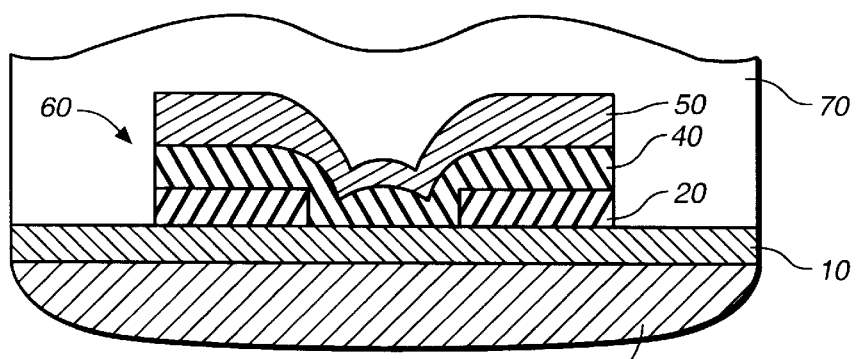
FIG._7
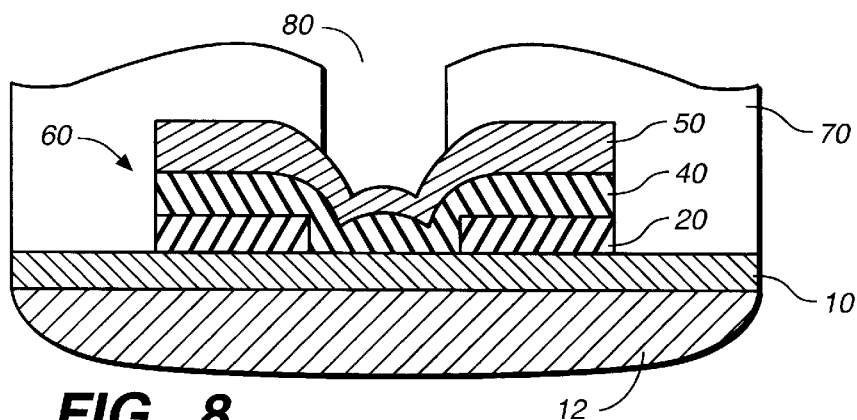
FIG._8
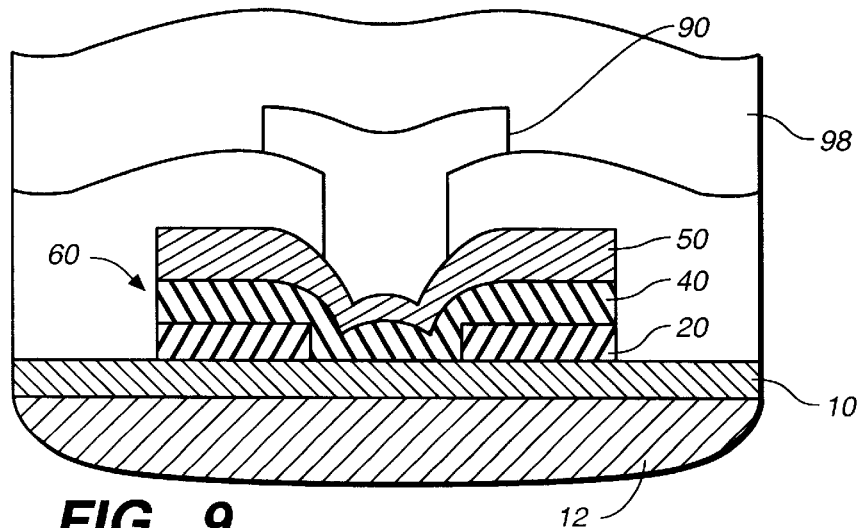
FIG._9
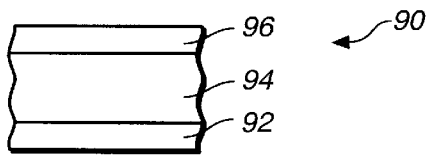
FIG._9A

METHOD OF FORMING ANTI-FUSE STRUCTURE

BACKGROUND OF THE INVENTION

1. Field of the Invention

The present invention relates generally to integrated circuits and to methods of forming anti-fuse structures used in fabricating integrated circuits. More particularly, the invention relates to methods of forming metal/amorphous silicon/metal anti-fuse structures which can be formed by the deposition of amorphous silicon on an unpatterned first metal layer.

2. State of the Art

Anti-fuse structures have been used in certain classes of integrated circuit (IC) chips, such as field programmable gate arrays, programmable read-only memories (PROMS) and the like. Field programmable gate arrays include a large number of logic elements, such as AND gates and OR gates, which can be selectively coupled together by means of anti-fuses to perform user designed functions. An unprogrammed anti-fuse type gate array is programmed by causing selected anti-fuses to become conductive.

Despite their being less popular than fuses, anti-fuses have the very desirable feature of being smaller in size than fuses. For example, a TiW fuse with a 2 μm neck and 6 μm end widths permits approximately 4,000 fuses to be provided on a typical device. In contrast, a 1 or 1.2 μm diameter anti-fuse via permits 80,000 to 100,000 fuses to be provided on a single device. Therefore, anti-fuse-based technology can provide significantly greater numbers of interconnections per device and greater storage capacity than can devices based on fuse technology.

Anti-fuses include a material which initially has a high resistance, but which can be converted into a low resistance material by the application of a programming voltage. For example, amorphous silicon, which has an intrinsic resistivity of approximately 1 mega-ohm/cm, can be fashioned into 1 μm wide link vias having a resistance of approximately 1 to 2 giga-ohms/cm.

These link vias can then be melted and recrystallized by the application of a programming voltage in the range of 10 to 12 volts d.c. to form link vias having a resistance less than 200 ohms. These low resistance vias can, for example, couple together logic elements of a field programmable gate array so that the gate array will perform user-desired functions, or can serve as memory cells of a PROM.

Among the prior art methods for forming anti-fuse structures, U.S. Pat. No. 5,328,865 discloses a method in which cusp-free anti-fuse structures are produced. In accordance with that method, an anti-fuse layer is formed directly on a conductive base layer, and anti-fuse islands are patterned on the unpatterned conductive base layer. Such process can be particularly problematic in the anti-fuse island patterning step, since the etching process is highly dependent upon selectivity of the anti-fuse material versus the underlying conductive base layer. Thus, overetching into the underlying conductive base layer may result.

SUMMARY OF THE INVENTION

In order to overcome the problems associated with known anti-fuse formation methods, a method of forming an anti-fuse structure is provided. In accordance with an exemplary embodiment of the invention, a conductive base layer is formed over a semiconductor substrate. An insulating layer is formed on the conductive base layer and is patterned to expose a portion of the conductive base layer. An anti-fuse layer is formed on the insulating layer and the exposed portion of the conductive base layer. A conductive protection layer is formed on the anti-fuse layer. An anti-fuse island is formed by sequentially removing a portion of the conductive protection layer, and underlying portions of the anti-fuse layer and the insulating layer. The conductive base layer is patterned after forming the anti-fuse island.

Preferably, the conductive base layer has a multi-layer structure, for example, a tri-layer TiW/Al/TiW structure. The insulating layer is typically an oxide layer, for example, a doped or undoped silicon oxide. Preferably, the anti-fuse material is amorphous silicon and the conductive protection layer includes an alloy of titanium and tungsten (TiW).

According to a further aspect of the invention, an interlevel dielectric layer can be formed on the conductive protection layer, and the interlevel dielectric layer patterned to form a via hole exposing a portion of the conductive protection layer. A conductive contact can then be formed in the via hole on the conductive protection layer. Preferably, the interlevel dielectric layer is a multi-layer oxide structure, and the conductive contact has a tri-layer structure, for example, a TiW/Al/TiW structure.

According to another exemplary embodiment of the invention, an anti-fuse structure is formed by first forming a conductive base layer over a semiconductor substrate. An oxide layer is then formed on the conductive base layer. The oxide layer is patterned, thereby exposing a portion of the conductive base layer. An amorphous silicon anti-fuse layer is formed on the oxide layer and the exposed portion of the conductive base layer. A TiW protection layer is formed on the anti-fuse layer, and an anti-fuse island is formed by sequentially removing a portion of the TiW protection layer, and underlying portions of the amorphous silicon anti-fuse layer and of the oxide layer. The conductive base layer is patterned after forming the anti-fuse island.

The method of the present invention can produce anti-fuse structures which are simpler to fabricate than known methods. Furthermore, problems associated with prior methods in patterning anti-fuse layers have been overcome by the use of a link insulating layer. Such layer can provide for excellent selectivity with respect to the anti-fuse island etching step.

BRIEF DESCRIPTION OF THE DRAWINGS

These and other advantages and objects of the invention will become more apparent from the following detailed description of preferred embodiments when read in conjunction with the attached figures, in which like reference numerals designate like features, and in which:

FIGS. 1 to 9 illustrate cross-sectional views of an anti-fuse structure during various stages of formation thereof, in accordance with an exemplary embodiment of the invention;

FIG. 1A illustrates a tri-layer conductive base layer in accordance with an exemplary embodiment of the invention; and FIG. 9A illustrates a tri-layer conductive contact in accordance with an exemplary embodiment of the invention.

DETAILED DESCRIPTION OF THE PREFERRED EMBODIMENTS

The method of the present invention will be discussed with reference to FIGS. 1–9, which illustrate cross-sectional views of an anti-fuse structure formed in accordance with an exemplary embodiment of the invention. While a single anti-fuse structure is shown in the drawings, it should be clear that a plurality of such structures are formed contemporaneously on a single substrate.

Each of the layers is formed and/or patterned using conventional semiconductor fabrication techniques, such as sputtering, chemical vapor deposition (CVD), spin-coating, photolithographic patterning and etching.

With reference to FIG. 1, a conductive base layer 10 is formed over a semiconductor substrate 12. Semiconductor substrate 12 can be any substantially planar surface capable of supporting the conductive base layer 10. The semiconductor substrate 12 is typically a silicon wafer, which can include an epitaxially grown or an oxidized surface layer.

The conductive base layer 10 is typically deposited to a thickness of from 6000 Å to 1 μm. As shown in FIG. 1A, the conductive base layer 10 is preferably a tri-layer metal structure comprising first, second and third layers 14, 16 and 18, respectively. In accordance with a preferred aspect of the invention, first layer 14 is preferably an alloy of titanium-tungsten (TiW), which serves as a barrier layer. First layer 14 is preferably deposited at a thickness of from 1200 to 3200 Å, more preferably from 2000 to 2400 Å.

The second layer 16 of the tri-layer conductive base layer 10 serves as a low resistance conductor for the conductive base layer, and is preferably aluminum or an alloy of aluminum and copper (AlCu). Second layer 16 is preferably deposited at a thickness of from 2000 to 6000 Å, more preferably from 3800 to 4200 Å.

The third layer 18 of the tri-layer conductive base layer serves as an anti-reflective coating (ARC) and also helps control diffusion of aluminum atoms from layer 16 into the anti-fuse layer, described below. Third layer 18 is preferably of the same material as the first layer 14 of the conductive base layer. Thus, in accordance with the exemplary embodiment, third layer 18 is a TiW alloy. Third layer 18 is preferably deposited at a thickness of from about 1250 to 2000 Å, more preferably from about 1300 to 1600 Å.

The layers of the conductive base layer 10 are typically deposited by sputter deposition. Suitable sputter deposition systems are commercially available from Varian, Inc. and Anelva Corporation. Depending on the specific material being formed, chemical vapor deposition (CVD) may be employed.

As shown in FIG. 2, a link insulating layer 20 is formed on the conductive base layer. The link insulating layer is preferably a silicon oxide layer, for example, a plasma deposited silicon oxide using TEOS (tetraethylorthosilicate) as a process material (hereinafter, a TEOS silicon oxide). The thickness of the link insulating layer 20 is preferably from about 200 to 2000 Å, more preferably from about 450 to 550 Å.

With reference to FIG. 3, a window 30 is opened in the link insulating layer 20 to expose a portion 32 of the conductive base layer 10. Patterning of link insulating layer 20 is accomplished by conventional photolithographic and etching techniques As shown in FIG. 4, an anti-fuse layer 40 is formed over the link insulating layer 20 and the exposed portion of the conductive base layer 10. Preferably, the anti-fuse layer 40 comprises amorphous silicon. The anti-fuse layer is typically deposited at relatively low temperature in a plasma enhanced chemical vapor deposition (PECVD) system, such as commercially available from Applied Materials, Inc. and Novellus Corporation. The thickness of the anti-fuse layer 40 is preferably from 100 to 2000 Å, more preferably from 900 to 1000 Å.

As can be seen in FIG. 4, cusping of the anti-fuse layer in the vicinity of the window 30 periphery occurs due to shadowing during the deposition process. The extent of cusping depends on the thickness of insulating layer 20.

With reference to FIG. 5, a conductive protection layer 50 is formed over the anti-fuse layer 40. The conductive protection layer protects the relatively fragile anti-fuse layer 40 from subsequent etching steps and provides a shield against the penetration of aluminum atoms and/or silicon diffusion into aluminum from subsequent thermal cycles during metallization steps. The conductive protection layer 50 is preferably the same material as that used in layers 14 and 18 of the conductive base layer 10. Thus, as with layers 14 and 18, the conductive protection layer is preferably a TiW alloy. The thickness of the conductive protection layer 50 is preferably from 200 to 2000 Å, more preferably from 1300 to 1700 Å.

With reference to FIG. 6, an anti-fuse island 60 is formed by standard photolithographic and etching steps. In particular, a resist pattern is applied to the surface of the conductive protection layer 50 by a spin-coater, the resist is exposed in a contact or stepper lithography system and the resist is developed to form a mask. The conductive protection layer, and underlying portions of the anti-fuse layer and the insulating layer are sequentially anisotropically etched, for example, by plasma etching. The etching steps can take place in a single or multiple process chambers. Plasma etch systems are commercially available from Applied Materials, Inc. and LAM Research Corp.

After the anti-fuse island 60 is formed, the conductive base layer 10 is patterned to form a plurality of rows which interconnect a plurality of the anti-fuse islands 60.

As illustrated in FIG. 7, an insulating layer 70 is formed over the anti-fuse island 60, the base layer 10 and the substrate 12. The insulating layer 70 preferably comprises a doped and/or undoped silicon oxide deposited by PECVD. Among the silicon oxides, PECVD-deposited phophosilicate glass (PSG) and TEOS silicon oxides are preferred. In accordance with an exemplary embodiment of the invention, insulating layer 70 is preferably a multi-layer structure which comprises both doped (e.g., PSG) and undoped (e.g., TEOS) silicon oxides, as well as spin-on glass (SOG) for surface planarization.

The overall thickness of the insulating layer 70 is preferably from 1000 to 10,000 Å, preferably from 4000 to 8000 Å. Fabrication of an insulating layer 70 in accordance with a preferred embodiment of the invention will now be described.

First, from 500 to 5000 Å, preferably from 1000 to 2000 Å, of a doped oxide, such as PECVD PSG is deposited as a bottom layer of the insulating layer 70 over the anti-fuse island 60, the base layer 10 and the substrate 12. This is followed by deposition of 1000 to 5000 Å, preferably from 2000 to 3000 Å, of an undoped oxide, preferably a plasma TEOS oxide over the bottom layer. For surface planarization, one or more, preferably two, layers of SOG can next be deposited at preferably from 1000 to 2000 Å each. A second undoped oxide, preferably another plasma TEOS oxide, can next be deposited as the top layer. The thickness of this top layer is from 2000 to 8000 Å, preferably from 3500 to 4500 Å. To obtain a substantially planar surface, the multi-layer insulating structure described above is etched back, thereby removing most of the SOG.

With reference to FIG. 8, the insulating layer 70 is patterned using photolithography and etching processes to provide a via hole 80. The via hole 80 is aligned with the anti-fuse island 60. Additional via holes are also provided which are aligned with a portion of the conductive base layer 10. The via holes are provided to permit electrical contact to the anti-fuse island 60 and the conductive base layer 10.

As illustrated in FIG. 9, a conductive contact 90 is formed in via holes 80 (as well as in the other via holes formed but not illustrated). The contacts extend into the via holes to provide electrical contacts to the underlying structures. The contacts are also typically interconnects which couple a number of structures together or which serve to conduct electrical signals within the integrated circuit device. For example, a contact can couple a column of anti-fuse islands together so that an individual anti-fuse island can be programmed or read by applying signals to a row of conductive base layer 10 and a column of conductive connection layer.

The conductive contact 90 can be formed by blanket depositing a conductive contact layer over the insulating layer 70 and then patterning and etching the conductive contact layer by conventional techniques. The conductive contact is preferably a multi-layer structure. In accordance with an exemplary aspect of the invention, and as shown in FIG. 9A, the conductive contact layer 90 is preferably a tri-layer metal structure comprising first, second and third contact layers 92, 94 and 96, respectively. First and third contact layers 92 and 96 are preferably TiW layers, while second contact layer 94 is preferably aluminum or an alloy of aluminum and copper (AlCu). These layers are preferably of the same compositions and thicknesses as layers 14, 16 and 18 of the conductive base layer described previously, and can be deposited in the same manner as those layers.

Finally, a passivation layer 98 can next be deposited over the conductive contact 90. Passivation layer 98 is typically a PECVD-deposited silicon oxide or silicon nitride layer. The thickness of passivation layer 98 is preferably from 7000 Å to 1.2 $\mu$m.

The anti-fuses in accordance with the invention, typically have an anti-fuse island 60 which is 1.2 $\mu$m in width and in length. A programming voltage of about 10 volts d.c. applied between the conductive base 10 and conductive contact 90 can generate a current of 20 mA through the anti-fuse layer, causing a change in state of the anti-fuse layer. This results in a bi-directionally conductive path between the two metal layers. The resistance of the programmed anti-fuse decreases with increasing programming current, and resistances of below 12 ohms can be achieved.

It will be appreciated by those skilled in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method of forming an anti-fuse structure, the method comprising the steps of:
   forming a conductive base layer over a semiconductor substrate;
   forming an insulating layer on the conductive base layer;
   patterning the insulating layer, thereby exposing a portion of the conductive base layer;
   forming an anti-fuse layer on the insulating layer and the exposed portion of the conductive base layer;
   forming a conductive protection layer on the anti-fuse layer;
   forming an anti-fuse island by sequentially removing a portion of the conductive protection layer, and underlying portions of the anti-fuse layer and of the insulating layer; and
   patterning the conductive base layer after forming the anti-fuse island.

2. The method according to claim 1, wherein the conductive base layer is a tri-layer structure.

3. The method according to claim 2, wherein the tri-layer structure is a TiW/Al/TiW structure.

4. The method according to claim 1, wherein the insulating layer is an oxide layer.

5. The method according to claim 1, wherein the anti-fuse layer is an amorphous silicon layer.

6. The method according to claim 1, wherein the conductive protection layer is a TiW layer.

7. The method according to claim 1, further comprising the steps of:
   forming an interlevel dielectric layer on the conductive protection layer;
   patterning the interlevel dielectric layer to form a via hole exposing a portion of the conductive protection layer; and
   forming a conductive contact in the via hole on the conductive protection layer.

8. The method according to claim 7, wherein the interlevel dielectric layer is an oxide layer.

9. The method according to claim 8, wherein the conductive contact has a tri-layer structure.

10. The method according to claim 9, wherein the conductive contact tri-layer structure is a TiW/Al/TiW structure.

11. A method of forming an anti-fuse structure, the method comprising the steps of:
    forming a conductive base layer over a semiconductor substrate;
    forming an oxide layer on the conductive base layer;
    patterning the oxide layer, thereby exposing a portion of the conductive base layer;
    forming an amorphous silicon anti-fuse layer on the oxide layer and the exposed portion of the conductive base layer;
    forming a TiW protection layer on the anti-fuse layer;
    forming an anti-fuse island by sequentially removing a portion of the TiW protection layer, and underlying portions of the amorphous silicon anti-fuse layer and of the oxide layer; and
    patterning the conductive base layer after forming the anti-fuse island.

12. The method according to claim 11, wherein the conductive base layer is a tri-layer structure.

13. The method according to claim 12, wherein the conductive base layer tri-layer structure is a TiW/Al/TiW structure.

14. The method of forming an anti-fuse structure according to claim 11, further comprising the steps of:
    forming an interlevel dielectric layer on the conductive protection layer;
    patterning the interlevel dielectric layer to form a via hole exposing a portion of the conductive protection layer; and
    forming a conductive contact in the via hole on the conductive protection layer.

15. The method according to claim 14, wherein the interlevel dielectric layer is an oxide layer.

16. The method according to claim 14, wherein the conductive contact has a tri-layer structure.

17. The method according to claim 16, wherein the conductive contact tri-layer structure is a TiW/Al/TiW structure.

18. The method according to claim 1, wherein cusping of the anti-fuse layer occurs during formation thereof.

19. The method according to claim 11, wherein cusping of the anti-fuse layer occurs during formation thereof.

* * * * *